United States Patent [19]

Gueugnon et al.

[11] Patent Number: 4,514,082
[45] Date of Patent: Apr. 30, 1985

[54] PATTERN GENERATOR FOR INTEGRATED CIRCUITS AND PROCESS OF GENERATING PATTERNS BY MEANS OF SAID GENERATOR

[75] Inventors: Catherine Gueugnon, Paris; Pierre Bernstein, Meudon, both of France

[73] Assignee: Cii Honeywell Bull (Societe Anonyme), Paris, France

[21] Appl. No.: 554,804

[22] Filed: Nov. 23, 1983

[30] Foreign Application Priority Data

Nov. 29, 1982 [FR] France ................. 82 19997

[51] Int. Cl.³ .................. G03B 27/44; G03B 27/32
[52] U.S. Cl. ............................ 355/54; 355/77
[58] Field of Search ................. 355/53, 54, 77

[56] References Cited

U.S. PATENT DOCUMENTS

| 3,632,205 | 1/1972 | Marcy | 355/53 |
| 3,909,130 | 9/1975 | Glaskov et al. | 355/54 X |
| 4,110,762 | 8/1978 | Tigreat | 355/53 X |
| 4,362,385 | 12/1982 | Lobach | 355/77 |

FOREIGN PATENT DOCUMENTS 0063916 11/1982 European Pat. Off. .

OTHER PUBLICATIONS

IEEE Transaction on Electron Devices, 1981, vol. ED-28, pp. 1416-1421.

Primary Examiner—Donald A. Griffin
Attorney, Agent, or Firm—Kerkam, Stowell, Kondracki & Clarke

[57] ABSTRACT

A pattern generator for integrated multilayer circuits, comprising a light source (SLI) for each one of the layers, at least one associated reticle (RETMI) bearing patterns to be reproduced thereon and which is transparent to light, and optical means (MPI) for projecting and focusing the image of the patterns on the layer. The generator is characterized in that with a polarizer (POLI) being connected to the source, the reticle comprises a thin layer (GRI) of magnetooptical material with a magnetization which is at right angles to its surface, the image not the patterns being restituted by a light meter (ANALI).

6 Claims, 11 Drawing Figures

PATTERN GENERATOR FOR INTEGRATED CIRCUITS AND PROCESS OF GENERATING PATTERNS BY MEANS OF SAID GENERATOR

BACKGROUND OF THE INVENTION

1. Field of the Invention

This invention relates to a pattern generator, a pattern generating reticle and a process for generating patterns utilizing said generator and reticle. More particularly, it is applicable to the production of very large scale integration (VLSI) circuits used in the electronic circuits of information processing systems.

2. Description of the Prior Art

The techniques presently used in the production of electronic circuits of information processing systems increasingly call for the use of VLSI circuits. These integrated circuits are generally offered in the form of small rectangular or square wafers, usually called "chips", having sides measuring a few millimeters. In current practice, manufacturing technologies allow the arrangement of several tens of thousands of transistors inside each one of these chips, together with their conductive interconnecting networks.

For the sake of simplicity, an integrated circuit can be defined as a pile or stack of different layers on a silicon substrate. These different, extremely thin, layers can for example, be composed of silicon oxide, phosphosilicate glass, silicon nitrite, polysilicon, metal semiconductors or layers of aluminum. During the fabrication of integration circuits, several chips that are physically different from one another can be placed on the same silicon substrate. Thus, on a silicon substrate having dimensions that are essentially the same as those of a disk having a diameter on the order of 120 mm, one can produce several tens of chips having, for example, the form of squares on one side. When the fabrication of all of the chips arranged on a common substrate is complete, they are physically separated from one another, e.g., by sawing.

To prepare each one of the layers of the same chip, the manufacturing process thereof consists of several stages which utilize different techniques, such as deposition of material on the layer, etching, doping of the layer, oxidation of the layer, etc. For each of these different stages, it is necessary to delimit on the layer of the chip being prepared one or more geographical areas on which is defined a plurality of patterns. This operation is carried out by means of a technique usually called photolithography.

Photolithography consists, first, in coating the layer of the integrated circuit to be treated with a photosensitive resin. This resin coated layer is then lighted or illuminated by an appropriate luminous radiation, either through a mask or through a reticle bearing the representation of the group of patterns to be reproduced on the area of the layer of the integrated circuit to be treated. This latter operation is presently known as the name "exposure" operation.

During this exposure, the illuminated areas of the resin undergo a chemical transformation. There are two types of photosensitive resins, namely, positive resins and negative resins. In the case of positive resins, one exposes (illuminates by luminous radiation) the areas which shall be treated by deposition, etchings, paroxidation, etc. In the case of negative resins, the areas which shall be protected are covered. Regardless of the type of resin, the resin of the exposed areas is dissolved in an appropriate chemical bath. Thus, it is obvious that the parts of the material coated with resin and which have not been exposed remain protected by the resin. One can then proceed to the various physicochemical treatments mentioned above using this resin mask.

As described hereinabove, the resin is illuminated through a mask or through a reticle. The mask is a representation on a scale 1 of the areas of the resin sought to be protected. During the exposure, the mask is brought into direct contact with the resin coated layer of the integrated circuit.

The reticle is a representation on a scale much larger than 1 (usually equal to 10) of the patterns that shall be reproduced on the area or areas of the resin coated layer to be treated. The image of this reticle is then projected in reduced form (the reduction ratio is equal to the reverse of the above mentioned ratio, i.e. one-tenth in the case where this scale is equal to 10) onto the resin coated layer.

Thus, at least one reticle or one masking corresponds to a given layer of a chip (very large scale integration circuit).

In view of the foregoing, it is clear that patterns can be generated on layers for integrated circuits include a source transmitting a beam of light (having a wavelength bordering on near-ultraviolet, for example); for each one of the layers, at least one associated reticle bearing patterns which shall be reproduced thereon, said reticle being transparent to the light beam transmitted by the source; and optical means for projecting the image of the patterns onto the layer of integrated circuit coated with photosensitive resin.

The assembly of means defined above is called a pattern generator for integrated circuits.

The chip-bearing substrate is arranged on a table which is insensitive to vibrations and is provided with a system enabling the substrate to move in accordance with two degrees of freedom, i.e., according to vertical OX and OY axes. This table is provided with an extremely accurate positioning system and is, for example, equipped with a laser interferometer (for example, of the type manufactured by HEWLETT PACKARD under No. 5501 A and described in their technical bulletins). The pattern generator is placed on a machine provided with an extremely fine optical alignment system which enables it, by means of special sighting marks, to obtain positioning accuracies of the chip on which one desires to reproduce the patterns in relation to the generator on the order of two-tenths of a micron.

Generally speaking, in current practice, a reticle is produced in the following manner: There is produced on a glass substrate (which must be transparent to the light beam transmitted by the source) a chromium layer which is then coated with an electrosensitive resin. The definition of an electrosensitive resin is quite similar to that of a photosensitive resin, the only difference being that it undergoes a chemical transformation under the action of an electron beam and no longer under the action of light.

If the resin is positive, the patterns are written by an electron beam in such a way that the areas which shall be treated (those forming the patterns) are exposed to said beam, whereas, if the resin is negative, the areas sought to be protected are exposed to the electron beam. The electrosensitive resin is then developed in an appropriate chemical bath, the chromium is then corroded, in the portions that are no longer protected by the resin.

When the reticle is completed, it is necessary to control the patterns that have been written thereon. If for any reason there is an excess of chromium on a given location, this excess is evaporated by a laser beam. On the other hand, if a pattern of chromium is missing on a given location, the whole procedure leading to the writing of the patterns by the electron beam as described earlier must be taken up again on said location. Experience has shown that if the writing of a reticle with the aid of an electron beam is rapid (half an hour), the control thereof is very long and may take several days, which makes this latter stage extremely expensive.

The system of stages leading to the generation of patterns on a layer for very large integration circuits described above constitutes a process for generating patterns on a layer for integrated circuits, whose essential successive operations are listed on the table in Appendix I.

Therefore, a great drawback in pattern generators used in the past as well as the generating process utilizing such generators is the mode of obtaining the reticle.

According to the invention, this disadvantage is overcome by replacing the reticle formed by a chromium deposit on a glass substrate with a magnetooptical reticle having magnetooptical materials and the Faraday effect are recalled to mind in the following section.

Among the magnetic materials having magnetooptical properties one includes especially the iron garnets, yttrium and rare earths (gadolinium, terbium, etc.). These materials and their magnetooptical properties are, for example, described in a paper entitled "Large Stable Magnetic Domains" written by G. R. Pulliam, W. E. Ross, B. McNeal, and R. S. Bailey published in Applied Physics 53(3), March 1982, pp. 27 54 to 27 58. Said materials are transparent to light. For any garnet of this type and, more generally, for any magnetooptical material, the magnetooptical effect is based on the principle of interaction between a polarized rectilinear light and the magnetic state of the garnet or of the material. If this interaction takes place because of the transmission of the light through the material, the magnetooptical effect is called "Faraday effect". If it takes place through reflection, the effect is called "Kerr effect". Hereinafter, this description will be limited to the Faraday effect.

It will be recalled that a light is polarized rectinearly in the plane when the electric field vector (and, hence, the magnetic induction vector) always retains the same direction in the plane perpendicular to the direction of propagation of the radiation. The plane of polarization is defined as the plane containing the direction of propagation of the light and the electric field vector.

The result of this interaction is a rotation of the electric field vector in the plane perpendicular to the direction of propagation (i.e., in the plane of polarization).

To observe this magnetooptical effect, a polarized rectilinear (preferably monochromatic) beam of light is transmitted over the surface of the magnetooptical garnet whose magnetization is usually normal to said surface (the garnet is said to have a vertical magnetization). It is observed that after passing through the layer of magnetic garnet, the electric field vector of the polarized light undergoes a rotation in the plane of polarization which, by convention, is considered equal to an angle $(-\theta)$ when the light encounters an area of the garnet where the magnetization is called negative (i.e., having the same direction of propagation of light and being equal to $(+\theta)$ as the polarized light passes through a zone where the magnetization is positive (direction opposite to the direction of propagation of the light).

To write patterns on the magnetooptical reticle, it suffices simply to write thereon by means of a magnetic or thermomagnetic transducer of the type used currently in magnetic disk storages domains of magnetization (e.g., positive) having the form of the patterns sought to be reproduced on a given layer for a very large scale integration circuit, the remainder of the reticle surface (except patterns) having a negative magnetization.

A magnetic transducer is usually composed of a magnetic circuit around which a winding is arranged and which includes an air gap.

A thermomagnetic transducer is formed, on the one hand, by a point-shaped heat source which allows the temperature of the magnetic material to rise locally above its Curie point or its point of compensation and, on the other hand, by a system which creates a permanent magnetic field having an intensity which is sufficient to orient the magnetization of the previously heated part during its cooling.

To project the image of the patterns (formed by the magnetic domains with a positive magnetization) of the reticle onto the resin coated layer for very large scale integration circuits, the reticle is illuminated with a polarized light beam. As it passes through the domains with a positive magnetization (the patterns), the electric field vector of the light undergoes a rotation equal to $(+\theta)$, whereas, as it passes through the areas of the reticle external to the domain forming the patterns, the electric field vector of the polarized light undergoes a rotation in the plane of polarization which 9 is equal to $(-\theta)$. If there is placed between the reticle and the layer of the integrated circuit a light meter formed by a crystal oriented in its direction of propagation and arranged in such a way that said direction is at right angles to the direction occupied by the electric field vector of the transmitted light as the latter passes through a domain with a negative magnetization, a light with zero intensity is absorbed at the outlet of the light meter as the light passes through a domain with a negative magnetization, whereas a light having non-zero intensity is absorbed as the light passes through a domain with a positive magnetization (one pattern).

In other words, due to the presence of the light meter, everything happens as if only domains with a positive magnetization transmitted the light. It should be obvious that the light meter could be placed differently, so that only domains with a negative magnetization transmits the light. Thereby, one can project the image of the domains with a positive magnetization (patterns) on the layer for integrated circuits onto which one seeks to reproduce these patterns.

SUMMARY OF THE INVENTION

According to the teachings of the invention, the pattern generator for integrated circuits composed of a pile or stack of different layers, comprises: a source transmitting a light beam; for each one of the layers, at least one associated reticle bearing patterns to be reproduced thereon and which is transparent to the light beam from the source; optical means for projecting the image of the patterns onto the layer coated with photosensitive resin.

This generator is characterized by the fact that a light polarizer is connected to the source and the reticle comprises a thin layer of magnetooptical material with a magnetization which is perpendicular to its surface, where the patterns are formed by magnetic domains with a given shape and having a magnetization which is opposite to the magnetic environment surrounding them, the image of the patterns being reinstituted by a light meter.

The invention also relates to a process of generating patterns on a layer for integrated circuits which comprises the following operations or steps:

1. formation of a reticle by depositing a thin layer on a medium which is transparent to light, and the writing of patterns thereon;
2. verification of the patterns thus obtained;
3. coating of the layer for integrated circuits with photosensitive resin;
4. projection of the image of the reticle onto the layer for integrated circuits; and
5. development of the image of the patterns projected onto the layer in a bath which dissolves the parats of the layer exposed to light during the projection of the image of the reticle.

This process is characterized in that:

(a) the formation of the reticle is obtained by depositing a thin layer of magnetooptical material having a magnetization which is at right angles to its surface on the medium which is transparent to light;
(b) the writing of the patterns on the reticle is effected by means of a magnetic or thermomagnetic transducer;
(c) the verification of the patterns is effected by means of a magnetic transducer or a transducer using the magnetooptical effect; and
(d) the restitution of the image is effected by means of an assembly formed by a light polarizer and a light meter.

BRIEF DESCRIPTION OF THE DRAWINGS

Other features and advantages of this invention will become apparent in the ensuing description given by way of non-limitative example with reference to the accompanying drawings, in which:

FIGS. 6 and 7 are simplified diagrams of the pattern generator for integrated circuits according to the invention, wherein FIG. 6 is a side view; and
FIG. 7 is a ¾ perspective view;

FIGS. 9 and 10 show the writing of the magnetic domains forming the patterns on the magnetooptical garnet of the reticle pertaining to the pattern generator as known in the prior art wherein FIG. 9 is a ¾ perspective view; and
FIG. 10 is a top plan view;

DESCRIPTION OF THE PREFERRED EMBODIMENTS

Figure 1:
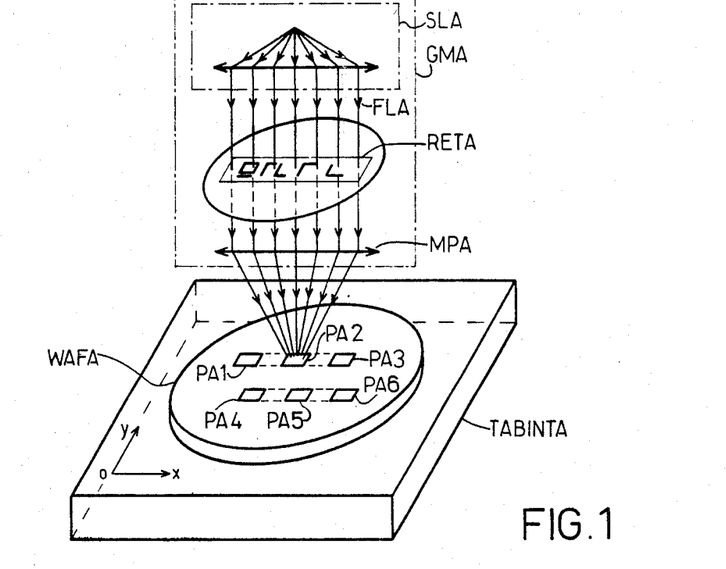
FIG. 1 is a diagram illustrating the principle of the pattern generators as known in the prior art.
Figure 2:
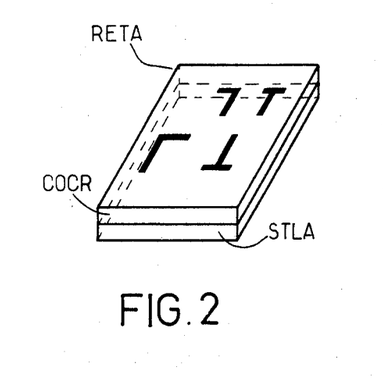
FIG. 2 is a perspective view showing a reticle on which are arranged several patterns that pertain to a pattern generator as known in the prior art.
Figure 3:
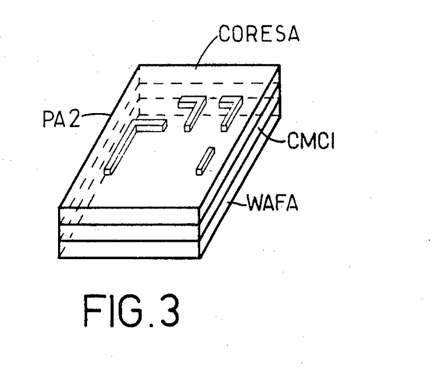
FIG. 3 shows a layer of integrated circuit coated with a photosensitive resin on which have been reproduced the patterns shown on the reticle of FIG. 2.
Figure 4A:
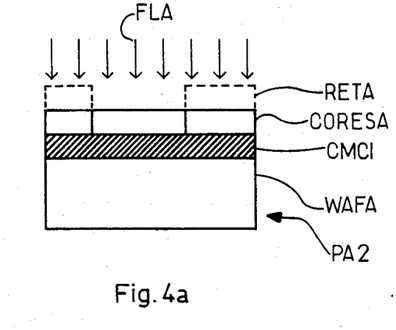
FIG. 4 is a combination of FIGS. 4a, 4b, 4c and 4d and shows the principal stages of a process for etching on a layer of an integrated circuit by photolithography.
Figure 4B:
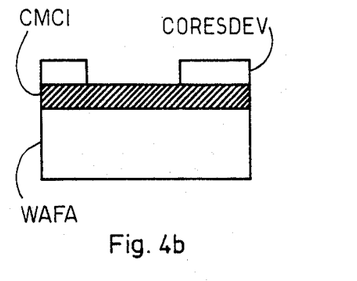
Figure 4C:
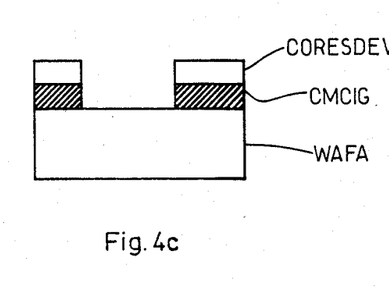
Figure 4D:
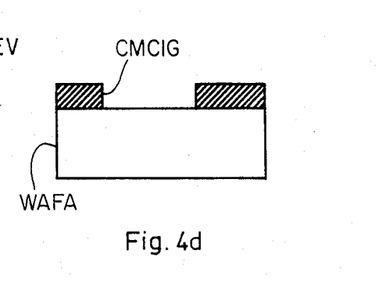
Figure 5A:
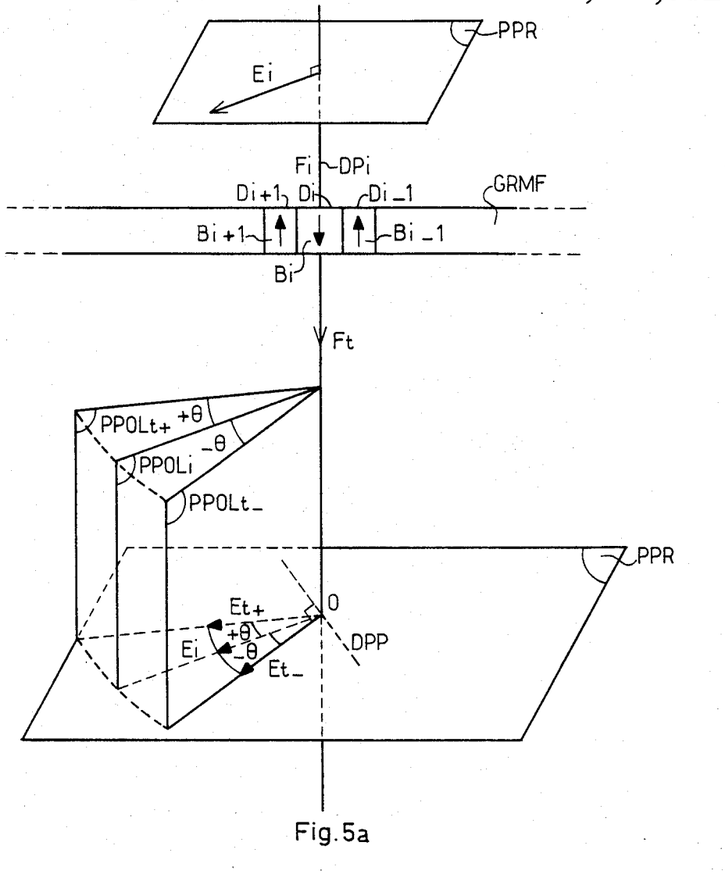
FIG. 5, a combination of FIGS. 5a, 5b, 5c, call to mind the magnetooptical Faraday effect of magnetooptical garnets.
Figure 5B:
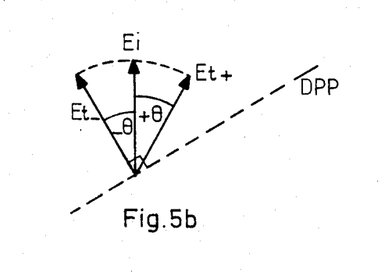
Figure 5C:
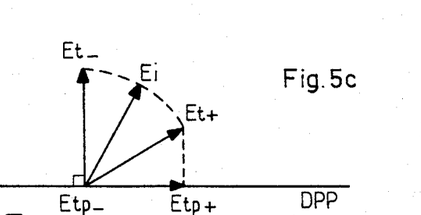

For a better understanding of the constructional principles and the operation of the pattern generator for integrated circuits according to the invention, it is useful to recall to mind the pattern generators as known in the prior art and shown in FIGS. 1 and 2 as well as the principles of photolithography, shown in FIGS. 3 and 4 and, finally, the Faraday effect of magnetooptical garnets shown in FIGS. 5a, 5b, and 5c.

Now referring to FIG. 1, which shows the main elements of a pattern generator GMA as known in the prior art.

These constituent elements are as follows:

a light source SLA;
a RETA reticle; and
means MPA for projecting the image of the patterns carried by the reticle RETA on a layer for integrated circuits such as one of the chips PA1, PA2 to PA6 arranged on a silicon substrate WAFA.

The silicon substrate WAFA is placed on a table interferometer TABINTA. The position of each one of the chips PA1 to PA6 is marked very accurately by a measuring system with an interferometer that uses, for example, a laser interferometer of the type 5501A of HEWLETT PACKARD. The marking of the chips is effected in relation to a system of rectangular axes OX, OY.

The assembly of elements forming, on the one hand, the pattern generator and, on the other, the silicon substrate provided with its chips PA1 to PA6 are aligned in relation to each other by an extremely fine optical alignment system that uses special sighting marks, the accuracy of alignment of the chips in relation to the generator being on the order of two-tenths of a micron.

As can be seen in FIG. 2, the reticle RETA which includes a medium STLA which is transparent to light, e.g., a glass substrate, on which a thin layer of chromium COCR (the description of the mode of obtaining such a reticle is given hereinabove) is deposited. The patterns shown in FIG. 2 are supposed to have been obtained by corroding or etching the chromium layer COCR, so that a beam of light can be transmitted therethrough.

The operation of the pattern generator GMA is known in the prior art. To this end, the light source LA transmits a parallel beam of light FLA. The light is transmitted by the patterns of the reticle RETA. The projection means MPA project the reduced image of the patterns onto one of the chips arranged on the substrate WAFA. As can be seen in FIG. 1, the images of the patterns of the reticle RETA are projected onto the chip PA2. As a rule, the reduction ratio of the patterns of the reticle to their images on the chips PA1 to PA6 is 1:10. The reduced image of the patterns of the reticles RETA is projected onto the layer of resin CORESA previously deposited on the layer CMCI of the wafer PA2, said layer being, in turn, deposited on the silicon substrate WAFA, (cf. FIG. 3). The various stages of obtaining, by etching patterns on the layer CMCI of the chip PA2 by means of a photolithographic process, are shown in FIGS. 4a to 4d. These various stages are as follows:

(a) exposure: The beam of light FLA passes through the patterns of the reticle RETA and is transmitted by projection means MPA, which project the reduced image thereof onto the resin layer CORESA which coats the layer CMCI of the wafer PA2 (FIG. 4a). If the resin CORESA is a positive resin, the parts thereof which are exposed correspond to the patterns sought to be reproduced on the layer and which are those of the reticle RETA.

(b) development: the resin layer CORESA enters an appropriate chemical bath where it is developed. Only the parts that have been exposed (cf. FIG. 4a) are dissolved by this chemical bath. The resin layer CORES-DEV is obtained in this manner.

(c) etching of the patterns: through the resin mask CORESDEV the layer CMCI is etched at the sites which have been mentioned with reference to FIG. 4a. This results in the etched layer CMCIG.

(d) dissolution of the resin: The resin is dissolved in a chemical bath. One of the layers forming the chip PA2 is then produced and one can proceed to the next stage of the manufacturing process of the chip.

Now, reference will be made to FIGS. 5a, 5b and 5c.

FIG. 5a shows a thin layer (several microns) to several tens of microns thick) of a magnetooptical garnet GRMF having a perpendicular magnetization, that is to say, where the magnetization is normal to the surface layer. A certain number of magnetic domains with small dimensions (several microns to several tens of microns) are written on said garnet, only three of which are shown in FIGS. 5a for the sake of simplicity. These domains are, respectively, $Di-1$, $Di$, $Di+1$. The respective magnetic induction vectors of each of said domains are $Bi-1$, $Bi$, $Bi+1$.

An incident polarized, rectilinear light beam Fi according to a direction of propagation DPi is transmitted at right angles to the surface of the garnet GRMF. In a propagation plane PPR normal to the direction of propagation DPi the electrical field of the incident light polarized, rectilinear light beam Fi is Ei and has the direction indicated in FIGS. 5a, 5b and 5c, FIGS. 5a and 5b being views in the space of the plane PPR, while FIG. 5c is a projection onto said plane PPR. A polarization plane of the light beam Fi is defined by the direction of propagation DPi and the vector Ei and is called PPOLi.

It is assumed that the magnetooptical garnet GRMF can transmit light. In these conditions, as the rectilinear, polarized light beam passes through the garnet GRMF it becomes the transmitted beam Ft. As the mean Fi passes through a magnetic domain with a negative magnetization, such as the domain Di, the transmitted beam is such that its electrical field $Et-$ has rotated by an angle $(-\theta)$ relative to the field Ei of the incident beam Fi. The polarization plane of the transmitted beam Ft is then $PPOLt-$, the dihedral angle between said plane and the plane PPOLi also being equal to $(-\theta)$.

Likewise, as the incident beam Fi passes through a magnetic domain with a positive magnetization, such as, e.g., the domain $Di+1$ $(Di-1)$ of induction $Bi+1$, the transmitted beam Ft is such that its electrical field $Et+$ undergoes a rotation $(+\theta)$ in relation to the electrical field Ei of the incident beam Fi. The polarization plane $PPOLt+$ then encloses with the plane PPOLi a dihedral angle equal to $(+\theta)$.

FIG. 5b allows a better view of the relative positions of the electrical fields Ei, $Et-$, $Et+$ of the beams Fi and Ft, depending on whether Fi passses through a magnetic domain with a negative or positive magnetization.

To determine the direction of magnetization of each one of the domains Di, which amounts to determining whether the electric field vector has turned an angle $(-\theta)$ or an angle $(+\theta)$, a light meter element is placed on the propagation path of the transmitted beam Ft. The latter is usually composed of a crystal having a privileged direction of transmission of the polarization of the light, e.g., DPP, said direction being indicated by the solid lines in FIG. 5c. The light meter element is arranged such that this privileged direction DPP is normal to the electrical field $Et-$.

At the light meter outlet a light is absorbed whose luminous intensity is proportional to the square of the projection of the electric field vector onto the privileged direction DPP. Thus, if the beam Ft passes through a domain with a negative magnetization, a light will be absorbed at the light meter output having a luminous intensity which is proportional to the square of the module of the vector $Etp-$, projection of the vector $Et-$ onto the direction of polarization DPP. Likewise, if the beam Ft passes through a domain with a positive magnetization (such as $Di+1$), a light will be absorbed at the light meter output having a luminous intensity which is proportional to the square of the module of the vector $Etp+$, projection of the vector $Et+$ onto the direction DDP.

Thus, it is apparent that if the beam Ft has passed through a domain with a negative magnetization, a light will be absorbed at the light meter output which is almost zero, whereas, if the beam Ft has passed through a domain with a positive magnetization, a light will be absorbed at the light meter output having a luminous intensity which is not zero.

As stated above, the main drawback of the prior art pattern generators is the fact that the mode of producing and controlling the reticle is long and expensive. The present invention enables these disadvantages to be overcome by replacing the reticle of the prior art pattern generator by a magnetooptical reticle formed by the deposit of a thin magnetooptical layer with the Faraday effect onto a substrate which is transparent to light, e.g., a layer of magnetooptical garnet whose properties are those mentioned hereinabove and illustrated in FIGS. 5a, 5b and 5c.

Figure 6:
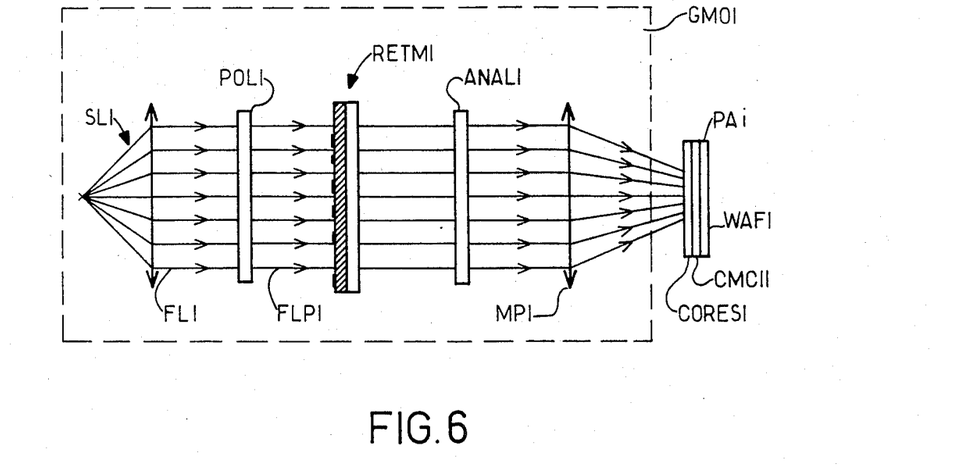
Figure 7:
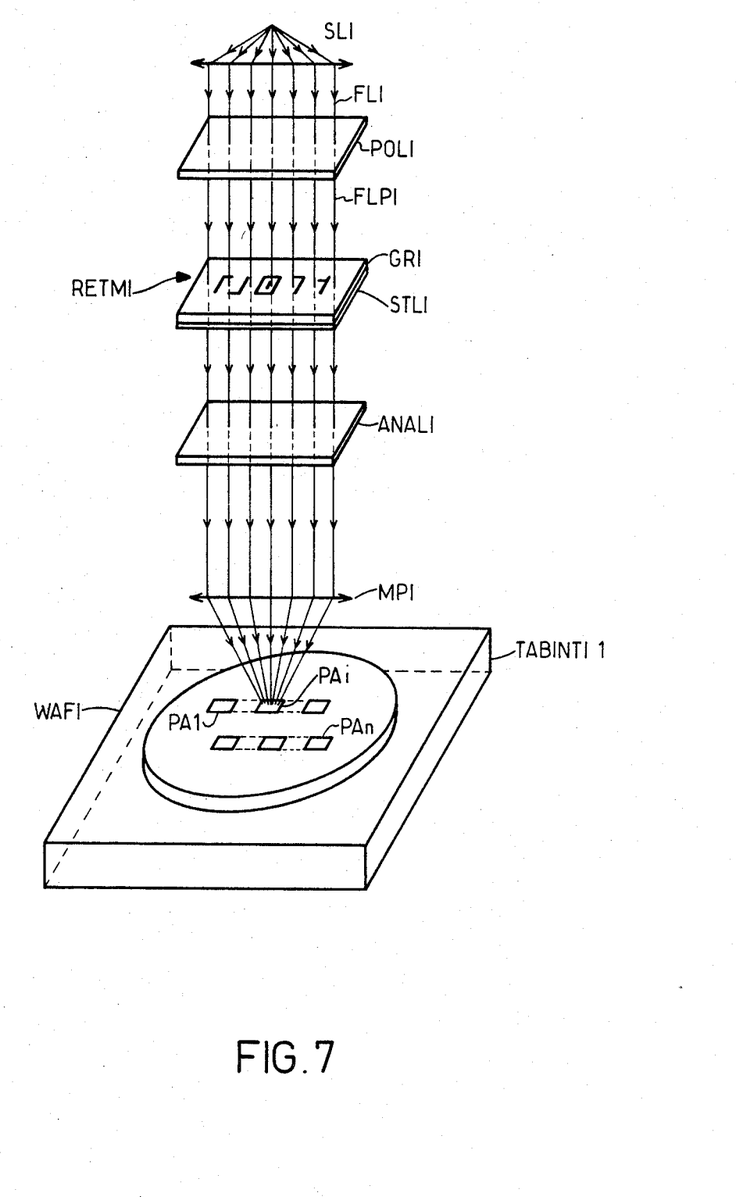

As apparent from FIGS. 6 and 7, the pattern generator of integrated circuits according to the invention (GMOI) comprises the following elements: a light source SLI; a polarizer POLI; a magnetooptical reticle RETMI; a light meter ANALI: projecting means MPI; means MPI for projecting the image of the patterns of the reticle RETMI onto a chip PAI placed on a silicon substrate WAFI. The latter is, in turn, placed on an interferometer table TABINTI of the same type as the interferometer table TABINTA shown in FIG. 1. The silicon substrate WAFI has n chips PA1, PA2, ..., PAi, ... PAn.

The assembly of elements of the pattern generator according to the invention GMOI on the one hand and the interferometer table TABINTI1 on the other hand are mounted in such a way that they are insensitive to vibrations.

The assembly of elements constituting the pattern generator GMOI, on the one hand, and the chip PAi, on the other, must be aligned with a high degree of precision in relation to each other. This alignment is effected by means of an extremely fine optical alignment system, allowing an accuracy of alignment on the order of two-tenths of a micron.

Figure 8:
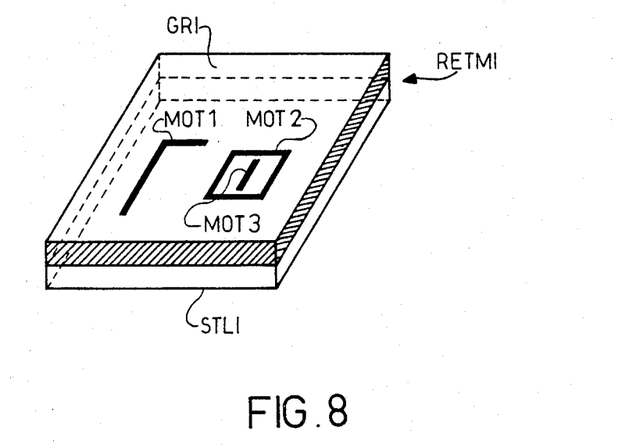
FIG. 8 is a perspective view showing a reticle provided with a given number of patterns and pertaining to the pattern generator embodying the invention.

As apparent from in FIG. 8, the reticle RETMI has a magnetooptical garnet having a thickness of from a few microns to several tens of a micron deposited on a substrate which is transparent to the light STLI. The magnetooptical garnet GRI has a magnetization which is at right angles to its surface. FIG. 8 shows several patterns MOT1, MOT2, MOT3, written on the magnetooptical garnet sought to be reproduced on the chip PAi. It stands to reason that the latter has been previously coated with a photosensitive resin layer CORESI.

The properties required for the magnetooptical garnet GRI of the reticle RETMI are as follows:

(a) have a strong rotation through the Faraday effect (angle called $-\theta$ or $+\theta$ in FIG. 5) in order to have at the output of the light meter ANALI a strong light contrast between the transmitted light corresponding to a domain with a negative magnetization and the transmitted light corresponding to a domain with a positive magnetization. The magnetic materials utilized to produce these garnets can have a Faraday effect to bring about a rotation higher than 50.000 degrees/cm which produces at the output of the light meter a light contrast of 250 for a garnet one micron thick. This means that if the light transmitted by a domain with a negative magnetization has a luminous intensity coefficient of 1, the light transmitted by a domain with a positive magnetization has a coefficient of 250;

(b) a weak absorption of the light, which allows one to avoid the heating of the material and the use of too powerful light sources;

(c) the possibility of producing these garnets on large surfaces on the order of 100×100 mm; and (d) a very small density of defects.

Figure 9:
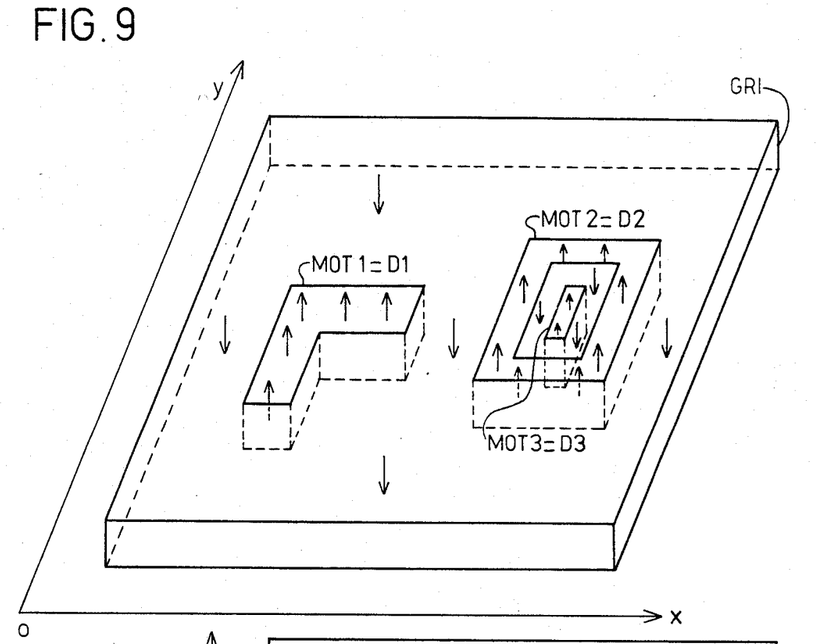
Figure 10:
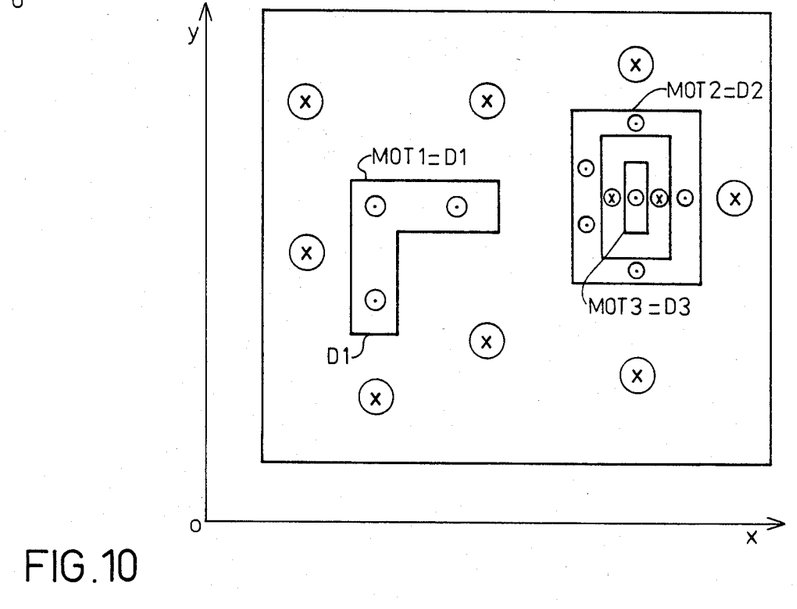

FIGS. 9 and 10 show in greater detail the three patterns MOT1, MOT2 and MOT3 of the magnetooptical garnet GRI shown in FIG. 8. These three patterns are formed by magnetic domains D1, D2, D3 having the particular shapes indicated on these same FIGS. 9 and 10. The magnetization in each one of the domains D1, D2, D3 is oriented upward and is thus supposed to be positive, whereas all the surface of the garnet GRI which does not constitute the domains (i.e., without the domains D1, D2, D3) has a magnetic domain which is oriented downward and, therefore, considered to be negative.

The operation of the pattern generator according to the invention GMOI is as follows: The light source SLI sends a parallel light beam FLI which, as it passes through the polarizer POLI, is polarized by the latter and becomes the polarized beam of light FLPI. This beam passes through the magnetooptical garnet and undergoes a rotation of its polarization plane through the Faraday effect equal to $(-\theta)$ if, for example, magnetic domains are involved with a negative magnetization (i.e., the surface of the garnet GRI which does not belong to the magnetic domains forming the patterns) and undergoes a rotation $(+\theta)$ as it passes through the domains where the magnetization is positive, i.e., the domains D1, D2, D3 which form the patterns sought to be reproduced on the chip PAi.

The light meter ANALI is supposed to be so arranged that at its output the light which has passed through the domains with a negative magnetization has an almost zero intensity, while the light transmitted by the domains with a positive magnetization has an intensity which is not zero (the ratio between the intensities due to the traversing of the domains with, respectively, a negative and a positive magnetization is, for example, on the order of 250, as stated earlier). Thus, one can say that the light meter ANALI restitutes the image of the patterns D1, D2, D3.

The projecting means MPI project a reduced image (usually on a scale 1:10) of the patterns of the reticle RETMI onto the resin layer CORESI. Thus, the resin CORESI is exposed according to the images of the patterns MOT1, MOT2, MOT3, and is then developed. One can then perform on the thin layer for integrated circuits CMCII of the chip PAi the successive operations which have been described in FIGS. 4c and 4d.

Figure 11:
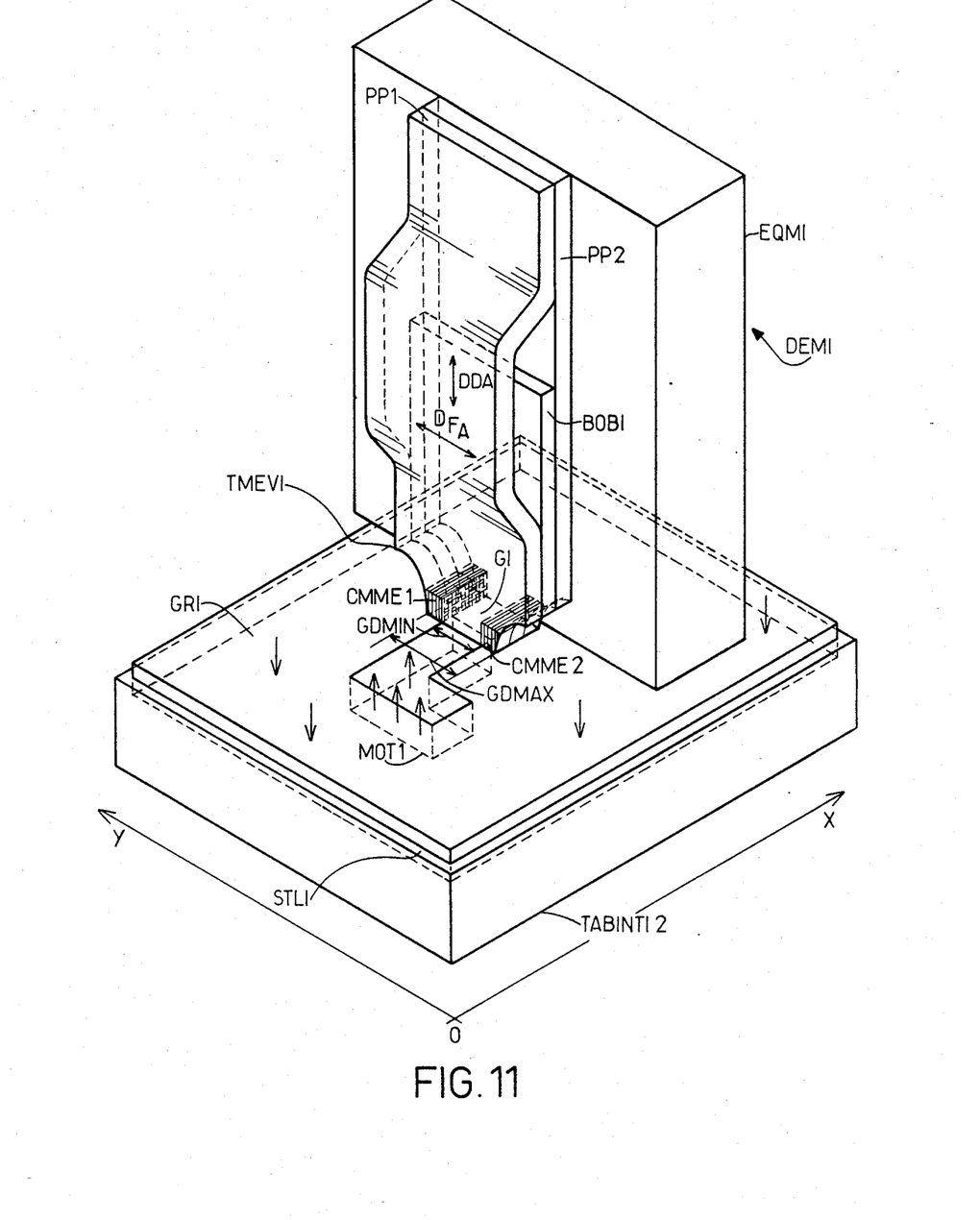
FIG. 11 is a ¾ perspective view showing the writing of the magnetic domains showing the patterns on the magnetooptical garnet of the reticle shown in FIGS. 9 and 10 by means of a magnetic transducer.

Now, referring to FIG. 11 which shows one embodiment of a device for writing patterns DEMI designed to write the patterns on a magnetooptical garnet such as GRI.

This device DEMI comprises:

a writing magnetic transducer TMEVI; and a transducer medium TMEVI opposite which an interferometer table TABINTI2 can move on which the magnetooptical garnet GRI is placed.

Preferably, the magnetic transducer TMEVI is a magnetic transducer of the integrated type similar to that described and claimed in patent application No. 80.07453 filed Apr. 2, 1980 by Compagnie Internationale Pour L'Informatique Cii-Honeywell Bull entitled "Magnetic Transducer With An Air Gap Of Large Variable Dimension For Reading and Writing Data Contained On A Magnetic Medium" and corresponding to U.S. Pat. Ser. No. 242,924, now U.S. Pat. No. 4,386,383, filed Mar. 12, 1981. This transducer TMEVI comprises a first polar piece PP1 and a second polar piece PP2 between which there is arranged a winding BOBI. The polar pieces PP1 and PP2 are designed in the form of piles of thin successive magnetic and insulating layers, while the winding BOBI is constructed in the form of a pile of thin successive conductive and insulating layers. Both polar pieces PP1 and PP2 are magnetically coupled to the end which is farthest away from the magnetooptical garnet GRI and are placed at the other end which is closest to said magnetooptical garnet substantially perpendicularly thereto so as to form the air gap there. The transducer has two thin layers of air gap CMME1 and CMME2 whose magnetic properties are such that, depending on the strength of the current flowing through the winding BOBI, the air gap has a large dimension varying between a minimum value GDMIN and a maximum value GDMAX.

Preferably, the polar pieces PP1 and PP2 are made from anisotropic material having a direction of easy magnetization DFA and a direction of difficult magnetization DDA.

To write domains representing the patterns which shall be reproduced on the chip PAi, such as the domains D1, D2, D3 shown in FIGS. 8, 9, 10, a current with a positive strength, for example, is made to flow through the winding BOBI and proper to the width of the lines of the patterns sought to be traced on the layer CMCII. These patterns are recorded in the form of domains with a positive magnetization.

In contrast, if one wishes to impart a negative magnetization, (i.e., apart from the patterns sought to be reproduced), a current with a negative strength is made to flow through the winding BOBI of the transducer TMEVI.

It is obvious that once the domains D1 to D3 are written on the garnet GRI, it is extremely simple to verify whether they have been written properly, i.e., whether they have been written at the desired locations, with the desired dimensions. This verification can be effected by means of an appropriate magnetic or magnetooptical transducer.

Thus, one sees immediately the advantage of the magnetooptical reticle used in the pattern generators taught by the invention; a relatively simple design and extremely (hence, inexpensive) pattern-writing and verifying operations which can be carried out with a magnetic or thermomagnetic transducer of the current type for the writing and with a magnetic or magnetooptical transducer of the current type for the verification.

From the foregoing one can easily deduce the sequence of operations constituting the process of generating patterns using the pattern generator according to the invention. These various operations are summarized in the table of Appendix II (after the desription). By comparing this table in Appendix II with that in Appendix I, one will be able to ascertain the greater simplicity of the pattern-generating process using the pattern generator of the invention compared with the process of generating patterns as known in the prior art.

PROCESS OF GENERATING PATTERNS ON A LAYER FOR INTEGRATED CIRCUITS AS KNOWN IN THE PRIOR ART

APPENDIX I

FIRST OPERATION

Manufacture of a reticle:
(a) depositing a thin layer on a medium which is transparent to light (e.g., this layer is made from chromium);
(b) depositing an electrosensitive resin on the chromium layer;
(c) writing patterns on the reticle by means of an electron beam;
(d) developing the resin in an appropriate chemical bath;
(e) corrosion of the chromium on the sites where the resin has been dissolved in the chemical bath.

SECOND OPERATION

Verification of the patterns obtained:
(a) if a line is missing, it is necessary to resume the process of generating patterns according to the first operation by depositing a new layer of chromium;
(b) if there is one line too much, it is made to disappear by illuminating it with a high-energy laser beam;
(c) when the reticle is correct, one proceeds to the third operation.

THIRD OPERATION

Coating of the integrated circuit layer of photosensitive resin.

FOURTH OPERATION

Projection of the image of the reticle onto the layer for integrated circuit coated with resin.

FIFTH OPERATION

Developing the image of the patterns projected onto resin protecting the layer of the integrated circuit by dissolution of the parts of the resin exposed to lighting the fourth operation.

PROCESS OF GENERATING PATTERNS ON A LAYER FOR INTEGRATED CIRCUIT ACCORDING TO THE INVENTION

APPENDIX II

FIRST OPERATION

Manufacture of the magnetooptical reticle by depositing a layer of magnetooptical garnet on a medium which is transparent to light and writing of the patterns on the reticle by means of a magnetic or thermomagnetic writing transducer.

SECOND OPERATION

Verification of the patterns of the reticle by means of a magnetic transducer or by utilizing the magnetooptical effect. If a line is missing it is easy to rewrite it by means of the writing transducer mentioned above. If there is one line too much, it is erased by means of the same writing transducer (by sending to the winding thereof a current which flows in a direction opposite to that with which the excess line was written).

THIRD OPERATION

Identical to the third operation in the table of Appendix I.

FOURTH OPERATION

The restitution and projection of the image of the reticle onto the layer for integrated circuits are effected by means of an assembly comprising a polarized light source, a light meter, and projecting means.

FIFTH OPERATION

Similar to the fifth operation in the table of Appendix I.

We claim:
1. A pattern generator for integrated circuits consisting of a stack of various layers comprising: a source (SLI) transmitting a beam of light; for each one of the layers at least one associated reticle (RETMI) bearing patterns to be reproduced thereon and which is transparent, at least one portion of its surface, to the beam of light from said source; optical means (MPI) for projecting the image of the patterns onto a layer coated with photosensitive resin, a light polarizer (POLI) connected to the source, the reticle (RETMI) comprising a thin layer of magnetooptical material with a magnetization which is at right angles to its surface, where the patterns are made up of magnetic domains (D1, D2, D3) with a given shape and a given magnetization which is opposite to the magnetic environment surrounding them, the image of said pattern being restituted by a light meter (ANALI).

2. The generator according to claim 1, wherein the magnetic material is a garnet (GRI) made from iron, yttrium and rare earth.

3. A process of generating patterns on a layer of integrated circuits comprising the steps of succcessively: formation of a reticle (RETMI) by depositing a thin layer on a medium which is transparent to light and writing of patterns (MOT1, MOT2, MOT3) on the reticle; verification of the patterns thus obtained; coating the layer of integrated circuits (CMCI) with a photosensitive resin (CORESI); projecting and focusing of the image of the reticle on the layer; developing the image of the patterns projected onto the layer in a bath which dissolves the parts of the layer exposed to light during the projection and focusing of the image of the reticle, characterized in that:

(a) the thin layer of a magnetooptical material (GRI) is deposited having a magnetization which is at right angles to its surface on the medium which is transparent to light (STLI);

(b) writing of the patterns on the thin layer of material is by means of a magnetic or thermomagnetic transducer, thus obtaining the reticle (RETMI);

(c) verification of the patterns is by a magnetic or magnetooptical transducer; and (d) projection is by means of an assembly made up of a polarizer (POLI) of the reticle (RETMI) and the light meter (ANALI).

4. A pattern-generating reticle for integrated circuits bearing patterns (MOT1, MOT2, MOT3) to be reproduced on at least one layer (CMCII) of the circuit which is transparent to light on at least one portion of its surface, comprising a thin layer of magnetooptical material with a magnetization which is at right angles to its surface where the patterns consist of magnetic domains (D1, D2, D3) with a given shape and a given magnetization which is opposite to that of the magnetic environment surrounding them.

5. The reticle according to claim 4, wherein the magnetic material is a magnetooptical garnet made from iron, yttrium and rare earth.

6. A process for producing a pattern-generating reticle for integrated circuits obtained by depositing a thin layer on a medium (STLI) which is transparent to light, comprising:

(a) depositing on the medium (STLI) a thin layer of magnetooptical material (GRI) having a magnetization which is at right angles to its surface on the medium which is transparent to light (STLI);

(b) writing patterns (MOT1, MOT2, MOT3) on the thin layer of magnetooptical material by means of a magnetic or thermomagnetic transducer (TMEVI); and (c) verifying the patterns (MOT1, MOT2, MOT3) so written by means of a magnetic or magnetooptical transducer.

* * * * *